(12) United States Patent
Reohr et al.

(10) Patent No.: US 6,269,040 B1
(45) Date of Patent: Jul. 31, 2001

(54) INTERCONNECTION NETWORK FOR CONNECTING MEMORY CELLS TO SENSE AMPLIFIERS

(75) Inventors: William Robert Reohr, Chappaqua, NY (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/603,632

(22) Filed: Jun. 26, 2000

(51) Int. Cl.[7] ........................................ G11C 7/02
(52) U.S. Cl. .......................... 365/210; 365/200; 365/201
(58) Field of Search ............................. 365/210, 200, 365/201, 196, 205, 208, 230.03

(56) References Cited

U.S. PATENT DOCUMENTS 6,108,259 * 8/2000 Choi et al. ........................ 365/210

* cited by examiner

*Primary Examiner*—David Nelms
*Assistant Examiner*—David Lam

(57) ABSTRACT

An interconnection network for connecting memory cells to sense amplifiers in a memory device includes a plurality of sub-arrays having memory cells, a plurality of switch units each of which is associated with a corresponding one of the plurality of sub-arrays, and true and complement input lines of the sense amplifiers each of which receives data from a selected memory cell via an input line and reference from reference cells via the other input line. The reference, which is a mid-level of data in the memory cells, is obtained from a reference cell having the mid-level value. Alternatively, a mid-level reference may be obtained by averaging data of logic values "1" and "0" stored in different reference cells. The reference cells may be disposed in the sub-arrays or outside the sub-arrays. The interconnection network of the present invention has symmetric configuration so that networks of the input lines of the sense amplifiers have substantially equal structure. Both inputs of a sense amplifier have substantially equal number of connections to data columns and reference columns.

31 Claims, 10 Drawing Sheets

INTERCONNECTION NETWORK FOR CONNECTING MEMORY CELLS TO SENSE AMPLIFIERS

STATEMENT OF GOVERNMENT RIGHTS

This invention was made with Government support under grant contract number MDA972-96-C-0030 awarded by the Defense Advanced Research Projects Agency (DARPA) of the U.S. Department of Defense. The Government has certain rights in the invention.

BACKGROUND OF THE INVENTION

1. Field of the Invention

The present invention relates to memory devices, and more particularly relates to an interconnection network for connecting data and reference cells to sense amplifiers in a memory device.

2. Description of the Related Art

Dynamic random access memory (DRAM) is one type of semiconductor memory device which has been and is widely used. DRAMs are volatile. EEPROM (Electrically Erasable and Programmable Read Only Memory) is another type of semiconductor memory device which is not volatile. A disadvantage of EEPROM is its lower speed in read/write operation as compared to DRAMs.

Owing to recent advances in magnetic materials, magnetic random access memory (MRAM) has been developed as one of non-volatile memory devices which is capable of higher speed operations, especially in the read process. An MRAM device typically includes a plurality of memory cells arrayed on intersections of word lines and bit lines. Each cell of a MRAM device may be a type of magnetic tunnel junction (MTJ), which has two magnetic layers separated by an insulating layer. Data stored in memory cells of MTJ type may be represented as a direction of magnetic vectors in the magnetic layers, and the memory cells can hold the stored data until the direction of magnetic vectors is changed by signals externally applied to the memory cells. A typical MRAM array of MTJ type is described in the article entitled "A 10 ns Read Write Non-Volatile Memory Array using a Magnetic Tunnel Junction and FET Switch in Each Cell" by Roy Scheuerlein, et al., pp. 128–129, ISSCC 2000.

It is well known that, in high density memory devices, asymmetric network affects sense amplifiers in a memory device, which are used to detect states of memory cells each having a logic state "0" or "1", or a state of similar magnitude. For example, noise sources can be unequally coupled to an asymmetric network connecting memory cells to sense amplifiers, thereby causing delay and/or disruption of signals being sensed in the amplifiers. In a dynamic sensing system, asymmetry in an interconnection network between sense amplifiers and memory array causes differences in load capacitance at the inputs of a sense amplifier. Such load capacitance difference in turn causes a delay in a transition of the sense amplifier either from "1" to "0" or from "0" to "1" (here, "0" and "1" are logic values). Thus, asymmetry in an interconnection network affects sensing speed of sense amplifiers. In an asymmetric interconnection network, the sensing of a valid state in a sense amplifier may also be degraded by coupling events from sources such as the substrate or neighboring metallic wires. An example of an asymmetric network is described in the article entitled "Non-Volatile RAM based on Magnetic Tunnel Junction Elements" by M. Durlam, et al., pp. 130–131, ISSCC 2000.

Thus, a need exists for a process for minimizing asymmetry in an interconnection network between memory cells and sense amplifiers in a memory device.

OBJECTS AND SUMMARY OF THE INVENTION

It is an object of the present invention to provide an interconnection network for connecting memory cells to sense amplifiers, wherein the interconnection network is symmetrically configured to prevent delay and to reduce noise associated with an asymmetric network.

It is another object of the present invention to provide an interconnection network for connecting memory cells to sense amplifiers, wherein an accurate reference signal is provided to the sense amplifier to enhance sensing operation of the sense amplifiers.

To attain the above and other objects and advantages, an interconnection network for connecting data and reference cells to sense amplifiers in a memory device according to the present invention, includes at least one sub-array having multiple memory cell columns and at least one reference cell column, wherein each memory cell column has a series of memory cells and each reference cell column has a series of reference cells; and at least one switch unit associated with the at least one sub-array, for selectively connecting the multiple memory cell columns to one of two inputs of a sense amplifier and selectively connecting the at least one reference cell column to the other of the two inputs of the sense amplifier, wherein the two inputs of the sense amplifier are substantially symmetric to each other such that each of the two inputs has substantially equal number of connections with the at least one switch unit. The at least one reference cell column has a series of reference cells, and each reference cell has a reference which has a mid-level value between a high and a low value of data in the memory cells. The at least one switch unit preferably includes switches each of which has a conduction path of which one end is connected to a corresponding memory cell column and the other end is connected to one of the two inputs of the sense amplifier; and at least one reference switch having a conduction path of which one end is connected to the at least one reference cell column and the other end is connected to the other of the two inputs of the sense amplifier, wherein the plurality of switches and the at least one reference switch are selectively switched under control of decoding signals externally applied. The two inputs of the sense amplifier each preferably have substantially equal number of connections with the switches and the at least one reference switch. The at least one switch unit may also include switches each of which has a conduction path of which one end is connected to a corresponding memory cell column and the other end is connected to one of the two inputs of the sense amplifier; and first and second reference switches having first and second conduction paths, respectively, the first conduction path connecting the at least one reference cell column to one of the two inputs and the second conduction path connecting the at least one reference cell column to the other of the two inputs of the sense amplifier, wherein the switches and the first and second reference switches are selectively switched under control of decoding signals externally applied. Each of the at least one sub-array may include first and second reference cell columns each having a series of reference cells, the first reference cell column having reference cells of logic high value and the second reference cell column having reference cells of logic low value, wherein the sense amplifiers are provided with a reference obtained from data of the logic high value and the logic low value stored in reference cells in the first and second reference cell columns, respectively. The at least one switch unit may also include switches each of which has a conduction path of which one end is connected to a corresponding memory cell column and the other end is connected to one of two inputs of a sense amplifier; and first and second reference switches having first and second conduction paths, respectively, the first conduction path connecting the first reference cell column to one of the two inputs and the second conduction path connecting the second reference cell column to the other of the two inputs of the sense amplifier, wherein the plurality of switches and the first and second reference switches are selectively switched under control of decoding signals externally applied. There may further provided a first connection unit for connecting first inputs of two sense amplifiers in response to a decoding signal externally applied; and a second connection unit for connecting second inputs of the two sense amplifiers in response to another decoding signal externally applied. Each of the two sense amplifiers preferably receives data from a selected memory cell via a first input and a reference via a second input, wherein the reference is obtained by averaging the logic high and low values of two selected reference cells in the first and second reference cell columns, respectively. The first inputs and the second inputs of the two sense amplifiers each have substantially equal number of connections with switches and connection units.

There is also provided an interconnection network for connecting data and reference cells to sense amplifiers in a memory device according to the present invention, including sub-arrays each having multiple memory cell columns, each memory cell column having a series of memory cells; switch units each of which is associated with a corresponding one of the plurality of sub-arrays, each switch unit selectively connecting the memory cell columns to one of two inputs of a sense amplifier under control of decoding signals externally applied, whereby data in a selected memory cell in a selected memory cell column is provided to the sense amplifier; and at least one reference cell disposed outside the plurality of sub-arrays, for providing a reference to the other of the two inputs of the sense amplifier, wherein the interconnection network is substantially symmetric such that each amplifier has substantially equal number of connections with the plurality of switch units and the at least one reference cell. Each of the switch units preferably includes switches each of which has a conduction path of which one end is connected to a corresponding memory cell column and the other end is connected to one of two inputs of a sense amplifier, wherein the switches are selectively switched under control of the decoding signals. The at least one reference cell preferably includes a first reference cell storing logic high value; and a second reference cell storing logic low value, the second reference cell being electrically connected to the first reference cell, wherein a connection node is formed between the first and second reference cells, and a pair of sense amplifiers coupled to the connection node share a reference obtained from the logic high and low values in the first and second reference cells. The at least one reference cell may also include a first pair of reference cells storing logic high and low values, respectively, for providing a first reference to first inputs of a pair of sense amplifiers; and a second pair of reference cells storing logic high and low values, respectively, for providing a second reference to second inputs of the pair sense amplifiers. Then, the interconnection network may further include a first switch portion for connecting the first pair of reference cells to each other in response to a decoding signal, whereby the first reference is provided to the first inputs of the pair of sense amplifiers; and a second switch portion for connecting the second pair of reference cells to each other in response to another decoding signal, whereby the second reference is provided to the second inputs of the pair of sense amplifiers. The first switch portion preferably includes a first switch for connecting the first input of one of the pair of sense amplifiers and one of the first pair of reference cells; a second switch for connecting the first input of the other of the pair of sense amplifiers and the other of the first pair of reference cells; and a third switch for connecting the first inputs to each other, wherein the first through third switches are simultaneously switched in response to the decoding signal. The second switch portion preferably includes a fourth switch for connecting the second input of one of the pair of sense amplifiers and one of the second pair of reference cells; a fifth switch for connecting the second input of the other of the pair of sense amplifiers and the other of the second pair of reference cells; and a sixth switch for connecting the second inputs to each other, wherein the fourth through sixth switches are simultaneously switched in response to another decoding signal.

There is also provided a method for connecting memory cell columns and reference cell columns to sense amplifiers each having true and complement inputs according to the present invention, including the steps of (a) providing first set of connections between the true inputs and memory cell columns having data stored in true form, (b) providing second set of connections between the complement inputs and memory cell columns having data stored in complement form, (c) providing third set of connections between the true and complement inputs and reference cell columns, (d) selecting at least one of the first set of connections to electrically connect corresponding at least one of the memory cell columns to at least one of true inputs, and simultaneously selecting at least one of the third set of connections to electrically connect corresponding at least one of the reference cell columns to at least one of the complement inputs, and (e) selecting at least one of the second set of connections to electrically connect corresponding at least one of the memory cell columns to at least one of complement inputs, and simultaneously selecting at least one of the third set of connections to electrically connect corresponding at least one of the reference cell columns to at least one of the true inputs. The true and complement inputs each have substantially equal number of connections of the first, second, and third sets of connections. Each of the reference cell columns preferably has a series of reference cells each of which stores a reference which is mid-level between high and low levels of data in memory cell columns. The reference cell columns may include a first set of reference cell columns each having a series of reference cells storing a high level value, and a second set of reference cell columns each having a series of reference cells storing a low level value. In the above method, the step (d) preferably includes (f) selectively connecting one of the first set of reference cell columns to one complement input, (g) selectively connecting one of the second set of reference cell column to another complement input, (h) electrically connecting the one of the first set of reference cell columns and the one of the second set of reference cell columns to sum the high and low values stored in the ones of the first and second sets of reference cell columns, respectively, (i) sharing a value summed in the step (h) as a reference by the one and another complement inputs. In the above method, the step (e) preferably includes (j) selectively connecting one of the first set of reference cell columns to one true input, (k) selectively connecting one of the second set of reference cell columns to another true input, (l) electrically connecting the one of the first set of reference cell columns and the one of the second set of reference cell columns to sum the high and low values stored in the ones of the first and second sets of reference cell columns, respectively, (m) sharing a value summed in the step (l) as a reference by the one and another true inputs.

There is also provided a method for connecting memory cells and reference cells to sense amplifiers each having true and complement inputs according to the present invention, including the steps of (n) providing first set of connections between the true inputs and memory cell columns each of which has a series of memory cells having data stored in true form, (o) providing second set of connections between the complement inputs and memory cell columns each of which has a series of memory cells having data stored in complement form, (p) providing third set of connections between the true and complement inputs and reference cells each having one of high and low level values, (q) selecting two of the first set of connections to electrically connect corresponding two of the memory cell columns to corresponding two true inputs, respectively, and electrically connecting a pair of reference cells having the high and low level values, respectively, to produce a summed value which is shared by two complement inputs corresponding to the two true inputs, and (r) selecting two of the second set of connections to electrically connect corresponding two of the memory cell columns to corresponding two complement inputs, respectively, and electrically connecting a pair of reference cells having the high and low level values, respectively, to produce a summed value which is shared by two true inputs corresponding to the two complement inputs. The memory cell columns are preferably arranged within sub-arrays and the reference cells are preferably disposed outside the sub-arrays. The true and complement inputs each preferably have substantially equal number of connections of the first, second, and third sets of connections. These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiment with reference to the following figures wherein.

DESCRIPTION OF PREFERRED EMBODIMENTS

Figure 1A:
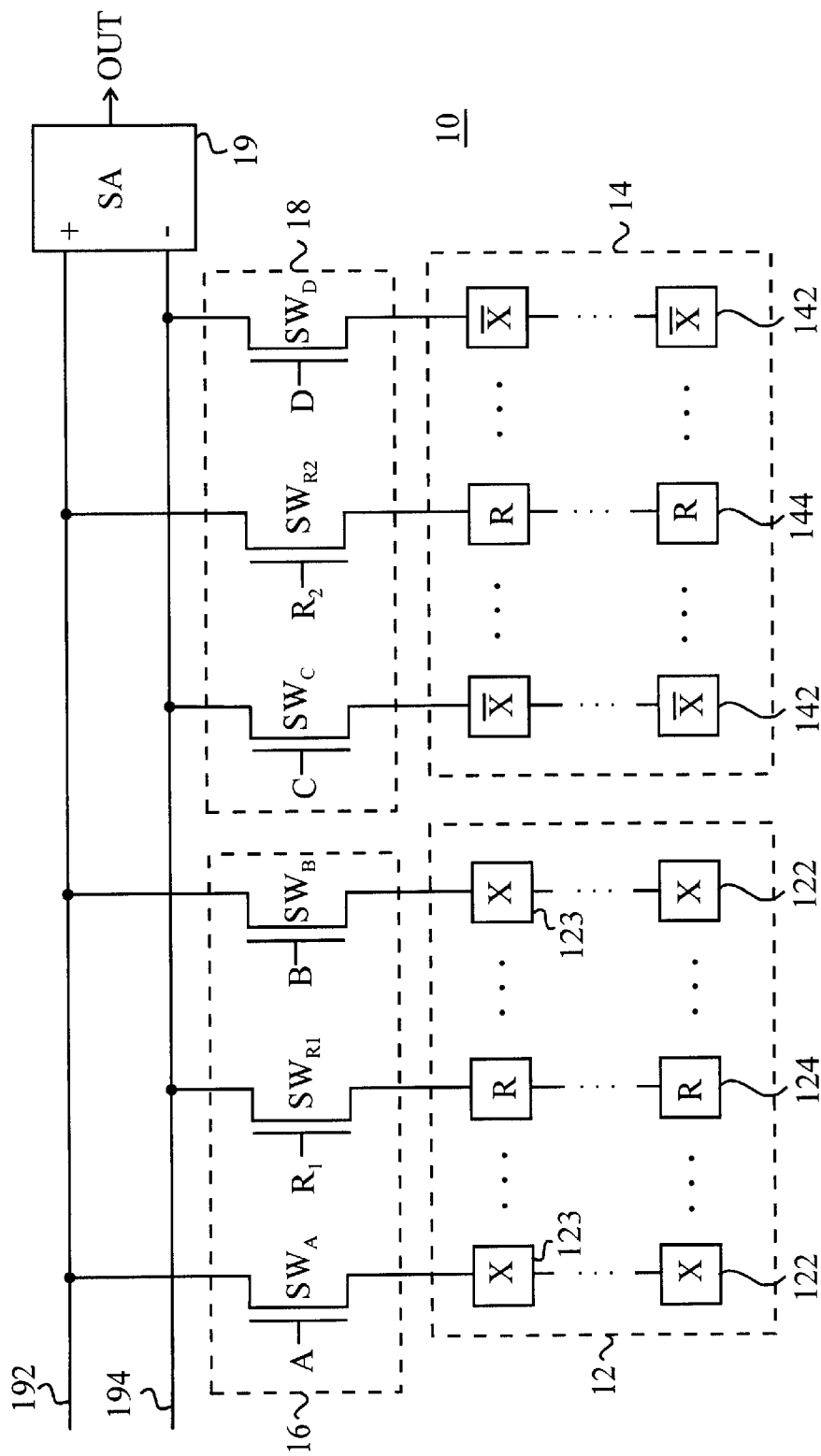
FIG. 1A is a schematic circuit diagram illustrating an embodiment of an interconnection network of the present invention.

Referring to FIG. 1A, there is provided an embodiment of an interconnection network for connecting memory cells to sense amplifiers according to the present invention. FIG. 1A schematically shows a part of a memory device using an interconnection network having symmetric configuration. A memory device 10 includes, for example, first and second sub-arrays 12, 14 each having memory cell columns 122, 142 and a reference cell column 124, 144, first and second switch units 16, 18 associated with the first and second sub-arrays 12, 14, respectively, and a sense amplifier 19 for sensing and amplifying data from a selected memory cell in the sub-arrays. As shown in FIG. 1A, the interconnection network with the sub-arrays 12, 14 and the switch units 16, 18 has a symmetric configuration, thereby allowing the memory device 10 to have high speed and common mode noise immunity.

In the first sub-array 12, there are multiple memory cell columns 122 (only two memory cell columns are shown in a sub-array for simplicity) and a reference cell column 124 which is preferably placed in the middle of the multiple memory cell columns 122. Each of the multiple memory cell columns 122 has a plurality of memory cells 123, and the reference cell column 124 has a plurality of reference cells R. A matrix of the data and reference cells are accessed by row lines (row line wire connection is not shown) and column lines. Selection of a cell in the memory sub-array is determined by a decoder or address controller as known in the art. In this embodiment, each memory cell has a value of logic "1" or "0" corresponding, for example, to a higher or lower resistance in the memory cell. In contrast, reference cells of a reference cell column each have a value of logic "½", which represents a middle level of logic "1" and "0", that is, a middle level of the higher and lower resistance of the memory cell.

The second sub-array 14 has the same configuration as the first sub-array 12. There are multiple memory cell columns 142 and a reference cell column 144 which is disposed in the middle of the multiple memory cell columns 142. Memory cells of the memory cell columns 142 each have a value of logic "1" or "0", and reference cells of the reference cell column 144 each have the mid-level ("½") reference. The data and reference cells in the second sub-array are also addressed by the word lines and bit lines.

Figure 1B:
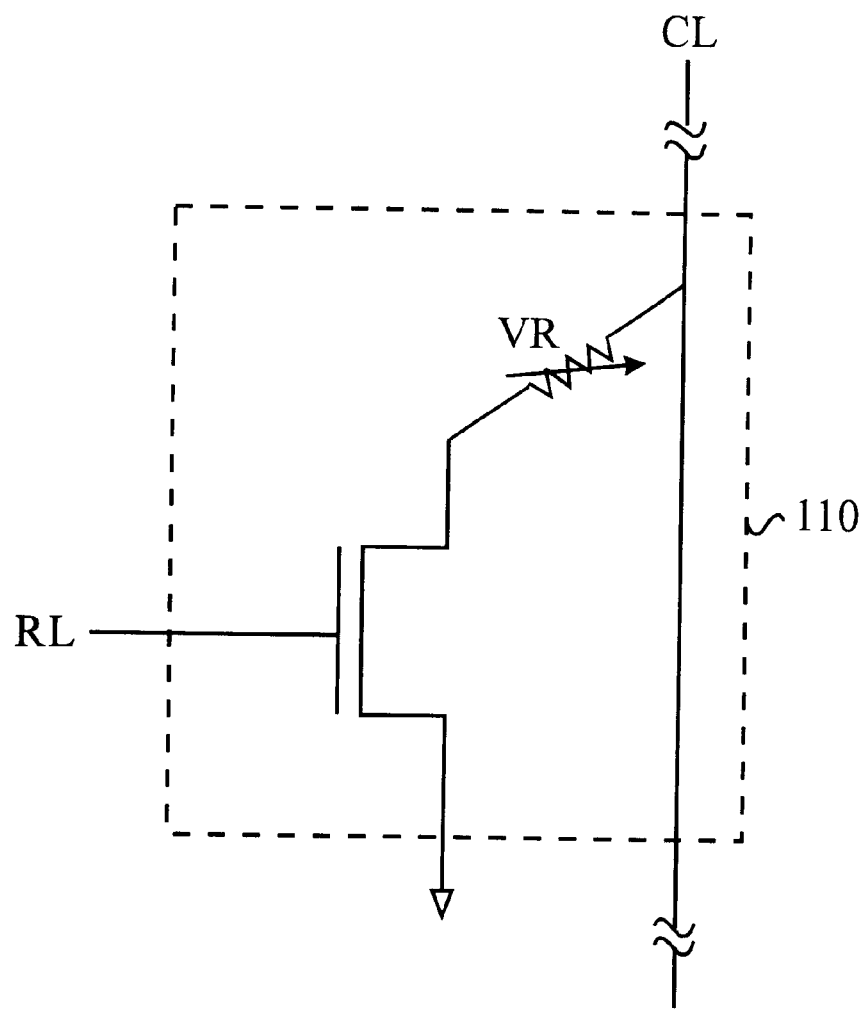
FIG. 1B is a schematic circuit diagram illustrating an exemplary memory cell.

Referring to FIG. 1B, a circuit diagram is provided to illustrate an example of a memory cell in a sub-array. Assuming that a memory cell 110 is addressed by a row line RL and a column line CL which are activated by address data, the memory cell 110 includes a variable resistor VR connected to the column line CL and an NFET controlled by the row line RL. The variable resistor VR represents an MTJ storage element which has one of two resistance levels (i.e., high or low level). Such a state/characteristic of the variable resistor VR is used to represent a Boolean value "1" or "0". A reference cell would have a mid-level resistance or "½" level and would serve as a threshold demarcator in a sensing operation, differentiating between a "1" and "0" value stored in a memory cell. The variable resistor VR has one end connecting to the column line CL and the other end connecting to the NFET. The NFET is gated by the row line RL and has a conduction path of which one end is connected to the variable resistor VR and the other end is grounded. Data read/write operation from/into a memory cell addressed by word and column lines is well known in the art, thus a description thereof is omitted.

Referring again to FIG. 1A, the first and second sub-arrays 12, 14 are associated with first and second switch units 16, 18, respectively. The first switch unit 16 has multiple switches each of which is coupled to a corresponding memory cell column of the first sub-array 12. A reference switch $SW_{R1}$ placed in the middle of the first switch unit 16 is coupled to the reference cell column 124, and other switches $SW_A$, $SW_B$ are coupled to corresponding memory cell columns 122, respectively. In a like manner, the second switch unit 18 associated with the second sub-array 14 has multiple switches each of which is coupled to a corresponding memory cell column of the second sub-array 14. A reference switch $SW_{R2}$ is coupled to the reference cell column 144 of the second sub-array 14, and other switches $SW_C$, $SW_D$ are coupled to corresponding memory cell columns 142, respectively. The reference cells of the second sub-array 14 also have the mid-level reference which is substantially equal to a value averaging the values of "1" and "0" of the memory cells.

Figure 2:
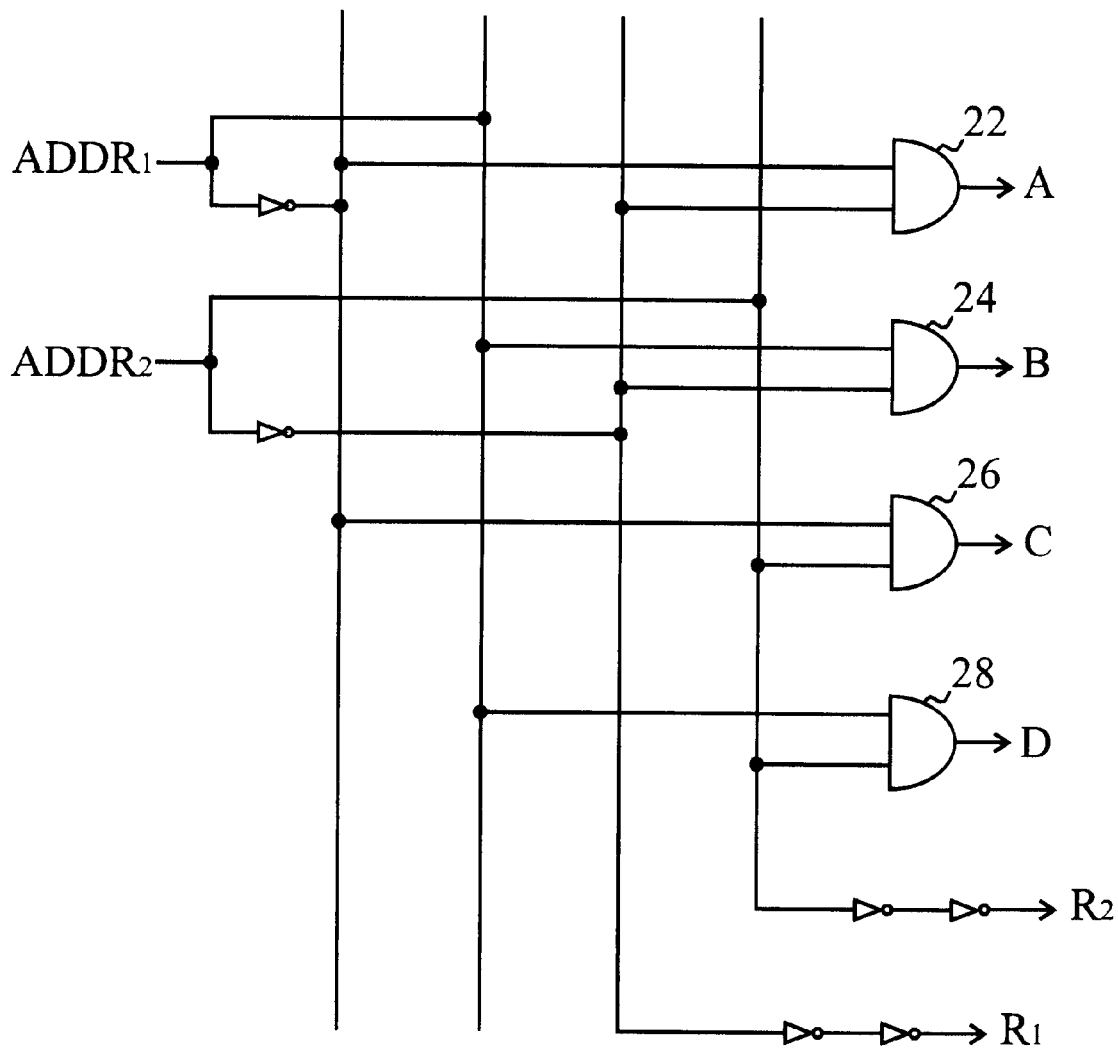
FIG. 2 is a logic gate diagram illustrating an embodiment of a decoder for generating decoding signals provided to an interconnection network of the present invention.

Switches in the first and second switch units 16, 18 controlled by decoding signals A–D, $R_1$, $R_2$ provided from a decoder (referring to FIG. 2). Under control of the decoding signals, the switches are selectively turned "on" of "off" so as to transfer data in a selected memory cell to a sense amplifier 19. A decoder generating the decoding signals and switching operation by the decoding signals will be described in detail.

The switches in switch units 16, 18 are connected to the sense amplifier 19 such that each switch has a conduction path of which one end is coupled to a corresponding memory cell column and the other end is coupled to either a true input line 192 or a complement input line 194 of the sense amplifier 19. For example, in the first switch unit 16, the reference switch $SW_{R1}$ has a conduction path of which one end is coupled to the reference cell column 124 and the other end is coupled to the complement input line 194 of the sense amplifier 19, and the other switches $SW_A$, $SW_B$ each have a conduction path of which one end is coupled to a corresponding memory cell column 122 and the other end is coupled to the true input line 192 of the sense amplifier 19. In the second switch unit 18, the reference switch $SW_{R2}$ has a conduction path of which one end is coupled to the reference cell column 144 and the other end is coupled to the true input line 192 of the sense amplifier 19, and the other switches $SW_C$, $SW_D$ each have a conduction path of which one end is coupled to a corresponding memory cell column 142 and the other end is coupled to the complement input line 194 of the sense amplifier 19.

It is noted that the arrangement of the memory cell columns in the first and second sub-arrays 12, 14 and the switches in the first and second switch units 16, 18 is symmetric. As a result, the interconnection network for connecting the memory cells and the sense amplifier 19 attains symmetry. In other words, the number of switch connections to the true and complement input lines are substantially equal. Due to such a symmetry, the true input line network and the complement input line network of the sense amplifier 19 may have substantially equal capacitance. As mentioned before, a symmetric interconnection network enhances speed and reduces noise in a memory device.

In the embodiment in FIG. 1A, the switches in the switch units 16, 18 are preferably realized by n-type field effect transistors (NFETs). A switch may be an NFET having a gate electrode receiving a decoding signal and a source and drain terminals which can form a conduction path connecting a memory cell column in the sub-arrays to the sense amplifier 19. Such an NFET switch is controlled by a decoding signal and, when activated by a high input, provides an electrical connection between a corresponding memory column and one of the input lines of the sense amplifier 19.

Referring to FIG. 2, there is illustrated a preferred embodiment of a decoder 20 receiving address data $ADDR_1$, $ADDR_2$ and generating decoding signals A–D, $R_1$, $R_2$ to be provided to the switch units 16, 18 in FIG. 1A. The decoder 20, for example, generates decoding signals A–D to control switches associated with memory cell columns and decoding signals $R_1$, $R_2$ to control switches associated with reference cell columns. It should be noted that a decoder for the switch units may be configured for any number of data and reference cell columns.

In this embodiment, the decoder 20 receives two-bit address data $ADDR_1$, $ADDR_2$ to generate the decoding signals A–D, $R_1$, $R_2$ which selectively control the switches $SW_A$–$SW_D$, $SW_{R1}$, $SW_{R2}$ of the switch units 16, 18. In response to the two-bit address data $ADDR_1$, $ADDR_2$ (i.e., "00", "01", "10", or "11"), one of the four decoding signals A–D becomes "High (H)" and one of the two decoding signals $R_1$, $R_2$ becomes "H", and all the other decoding signals become "Low (L)". For example, when the two-bit address data $ADDR_1$, $ADDR_2$ is "00", the decoding signal A generated by a first AND gate 22 becomes "H" and the decoding signal $R_1$ simultaneously becomes "H", and all other decoding signals B–D, $R_2$ become "L". When the two-bit address data $ADDR_1$, $ADDR_2$ is "10", the decoding signal B generated by a second AND gate 24 and the decoding signal $R_1$ simultaneously become "H" and all other decoding signals A, C, D, $R_2$ become "L". When the two-bit address data $ADDR_1$, $ADDR_2$ is "01", the decoding signal C generated by a third AND gate 26 and the decoding signal $R_2$ become "H" and all other decoding signals A, B, D, $R_1$ become "L". When the two-bit address data $ADDR_1$, $ADDR_2$ is "11", the decoding signal D generated by a fourth AND gate 28 and the decoding signal $R_2$ become "H" and all the other decoding signals A–C, $R_1$ become "L".

Referring to FIG. 1A again, when the two-bit address data $ADDR_1$, $ADDR_2$ is "00" so that the decoding signals A and $R_1$ become "H" and all the other decoding signals become "L", the switch $SW_A$ and the reference switch $SW_{R1}$ in the first switch unit 16 are turned on and all the other switches in the first and second switch units 16, 18 are turned off. Assuming that a memory cell in the memory cell column 122 coupled to the switch $SW_A$ is selected by a word line, data ("1" or "0") in the memory cell is transferred to the sense amplifier 19 via the switch $SW_A$ and the true input line 192. At the same time, a reference cell in the reference cell column 124 coupled to the reference switch $SW_{R1}$ is selected by the word line, thus reference ("½" level) in the reference cell is transferred to the sense amplifier 19 via the reference switch $SW_{R1}$ and the complement input line 194.

The sense amplifier 19 then senses input data by comparing the data ("1" or "0") from the memory cell against the reference ("½" level) from the reference cell. Since all other decoding signals B–D, $R_2$ are "L", the switches other than the switches $SW_1$ and $SW_{R1}$ are turned off so that the data and reference cell columns coupled to those off-switches do not interfere the data transmission from the selected data and reference cells to the sense amplifier 19.

In a like manner, when the two-bit address data $ADDR_1$, $ADDR_2$ is "01" so that the decoding signals C and $R_2$ become "H" and all other decoding signals become "L", the switch $SW_C$ and the reference switch $SW_{R2}$ in the second switch unit 18 are turned on and all other switches in the first and second switch units 16, 18 are turned off. As a result, data ("1" or "0") in a memory cell which is in the memory cell column 142 coupled to the switch $SW_C$ and is also selected by a word line, is transferred via the switch $SW_C$ to the complement input line 194 of the sense amplifier 19. At the same time, reference ("½" level) in a reference cell which is in the reference cell column 144 coupled to the reference switch $SW_{R2}$ and is also selected by the word line, is transferred to the sense amplifier 19 via the reference switch $SW_{R2}$ and the true input line 192. The sense amplifier 19 then senses input data by comparing the data ("1" or "0") from the memory cell against the reference ("½" level) from the reference cell. It should be noted that when a memory cell column is selected by the decoding signals, a corresponding reference cell column is selected which is in the same sub-array as the selected memory cell column is placed. As a result, data in a memory cell of the selected memory cell column and reference in reference cell of the corresponding reference cell column are transferred to the sense amplifier.

In this embodiment, data are preferably stored in the memory cells of the first sub-array 12 in its true form as represented by "X", and in the memory cells of the second sub-array 14 in its complement form as represented by "$\overline{X}$". The memory cell columns 122 having memory cells storing true data X are connected via the first switch unit 16 to the true input line 192 of the sense amplifier 19. The true data "X" propagates through the true or non-inverting input of the sense amplifier, wherein its signal strength is boosted and then is driven out through the output OUT of sense amplifier 19 unchanged. The true data "X" from a memory cell of memory cell column 122 remains in its true state "X". Memory cell columns 142 having memory cells storing complement data $\overline{X}$ are connected via the second switch unit 18 to the complement input line 194 of the sense amplifier 19. The complement data $\overline{X}$ propagates through the complement or inverting input of the sense amplifier 19, wherein it is inverted and amplified and then is driven out through the output OUT of the sense amplifier 19 having been inverted. The complement data "$\overline{X}$" from a memory cell of memory cell column 142 emerges from the sense amplifier 19 in its true form "X". Data stored in either sub-array 12 or 14 consistently emerges from the sense amplifier 19 in its true form "X". The data storage method has been adopted by the other embodiments of the invention, which have not yet been discussed but are depicted in FIGS. 3, 4A, 7, and 8.

The switches in the first and second switch units 16, 18 may also be viewed as two multiplexers. For example, the switches $SW_A$, $SW_B$, $SW_{R2}$ constitute a first multiplexer, and switches $SW_C$, $SW_D$, $SW_{R1}$ constitute a second multiplexer. The first multiplexer connects the true input line 192 of the sense amplifier 19 to the memory cell columns 122 having true data X and the reference cell column 144, and the second multiplexer connects the complement input line 194 of the sense amplifier 19 to the memory cell columns 142 having complement data $\overline{X}$ and the reference cell column 124. The first multiplexer receives decoding signals A, B, $R_2$, and the second multiplexer receives decoding signals C, D, $R_1$. Thus, in the first multiplexer, true data X from selected memory cells in the memory cell columns 122 and reference R from a selected reference cell in the reference cell column 144 are multiplexed with the decoding signals A, B, $R_2$ to provide one of the data to the true input line 192 of the sense amplifier 19. Also, in the second multiplexer, complement data $\overline{X}$ from selected memory cells in the memory cell columns 142 and reference R from a selected reference cell in the reference cell column 124 are multiplexed with the decoding signals C, D, $R_1$ to provide one of the data to the complement input line 194 of the sense amplifier 19. Therefore, the interconnection network in FIG. 1A may be configured with a true input network and a complement input network. The true input network includes the true input line 192 of the sense amplifier 19 and the first multiplexer for multiplexing true data X and reference R from the memory cell columns 122 and the reference cell column 144 with decoding signals A, B, $R_2$. The complement input network includes the complement input line 194 of the sense amplifier 19 and the second multiplexer for multiplexing complement data $\overline{X}$ and reference R from the memory cell columns 142 and the reference cell column 124 with decoding signals C, D, $R_1$. It should be noted that the true input network and the complement input network are substantially symmetrical with respect to each other.

Figure 3:
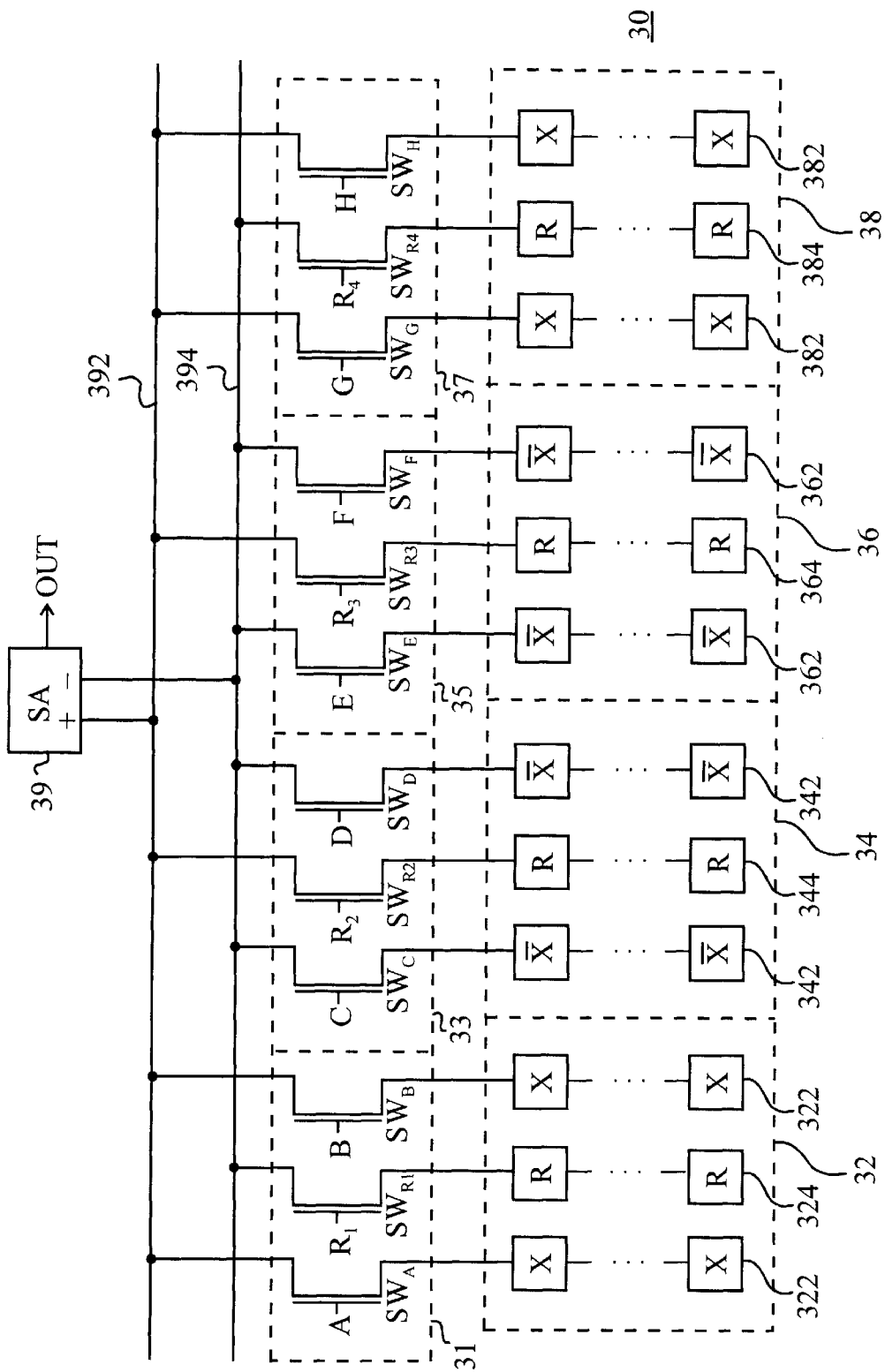
FIG. 3 is a schematic circuit diagram illustrating another embodiment of an interconnection network of the present invention.

Referring to FIG. 3, there is provided another embodiment of an interconnection network for connecting memory cells to sense amplifiers in a memory device. A memory device 30 includes four sub-arrays 32, 34, 36, 38 and four switch units 31, 33, 35, 37 associated with the four sub-arrays, respectively. As described for the embodiment in FIG. 1A, each sub-array has multiple memory cell columns and a reference cell column positioned in the middle of the 5 multiple memory cell columns. For example, the first sub-array 32 has memory cell columns 322 and a reference cell column 324 which is disposed in the middle of the memory cell columns 322, and in a like manner the second through fourth sub-arrays 34, 36, 38 have reference cell columns 344, 364, 384 disposed in the middle of memory cell columns 342, 362, 382, respectively. Each memory cell column has multiple memory cells ("0" or "1), and each reference cell column has multiple reference cells ("½").

The first through fourth switch units 31, 33, 35, 37 are associated with the first through fourth sub-arrays 32, 34, 36, 38, respectively, and have switches $SW_A$–$SW_H$ coupled to the memory cell columns and reference switches $SW_{R1}$–$SW_{R4}$ coupled to the reference cell columns. The switches $SW_A$–$SW_H$ and the reference switches $SW_{R1}$–$SW_{R4}$ are coupled to either a true input line 392 or a complement input line 394 of a sense amplifier 39. For example, in the first switch unit 31, switches $SW_A$, $SW_B$ coupled to the memory cell columns 322 are coupled to the true input line 392 and reference switch $SW_{R1}$ coupled to the reference cell column 324 is coupled to the complement input line 394; in the second switch unit 33, switches $SW_C$, $SW_D$ coupled to the memory cell columns 342 are coupled to the complement input line 394 and reference switch $SW_{R2}$ coupled to the reference cell column 344 is coupled to the true input line 392; in the third switch unit 35, switches $SW_E$, $SW_F$ coupled to the memory cell columns 362 are coupled to the complement input line 394 and reference switch $SW_{R3}$ coupled to the reference cell column 364 is coupled to the true input line 392; and in the fourth switch unit 37, switches $SW_G$, $SW_H$ coupled to the memory cell columns 382 are coupled to the true input line 392 and reference switch $SW_{R4}$ coupled to the reference cell column 384 is coupled to the complement input line 394.

The switches $SW_A$–$SW_H$, $SW_{R1}$–$SW_{R4}$ are controlled by decoding signals A–H, $R_1$–$R_4$, respectively. A decoder for generating the decoding signals A–H, $R_1$–$R_4$ may be realized with logic gates like those of the decoder 20 in FIG. 2, and may receive and decode, for example, three-bit or larger address data. The switches $SW_A$–$SW_H$, $SW_{R1}$–$SW_{R4}$ are switched by the decoding signals A–H, $R_1$–$R_4$ such that when one of the switches coupled to memory cell columns is turned on, a corresponding reference switch in the same switch unit is simultaneously turned on and all other switches in the same and other switch units are turned off. As a result, data ("1" or "0") in a memory cell of the selected memory cell column and a selected word line is provided to an input of the sense amplifier 39, and reference ("½") in a corresponding reference cell in the selected reference cell column and the selected word line is provided to the other input of the sense amplifier 39. For example, when decoding signal A is "H", decoding signal $R_1$ is also "H" and all the other decoding signals are "L". Thus, only the first memory cell column 322 and the reference cell column 324 in the first sub-array 32 are selected, and all other memory cell columns and reference cell columns in the first through fourth sub-arrays are not selected (i.e., not connected to either true or complement input line of the sense amplifier). The sense amplifier 39 then senses the data from the selected memory cell of the memory cell column 322 and the reference from the corresponding reference cell of the selected reference cell column 324. It should be noted that the sub-arrays and the switch units in this embodiment are also symmetrically configured so that the interconnection network for connecting the memory cells to the sense amplifier 39 attains symmetry.

In the embodiment in FIG. 3, improved tracking is advantageously obtained by embedding multiple reference cell columns in the respective sub-arrays to increase proximity between reference cells and memory cells, thereby reducing spatial noises such as power supply or substrate noise.

Figure 4A:
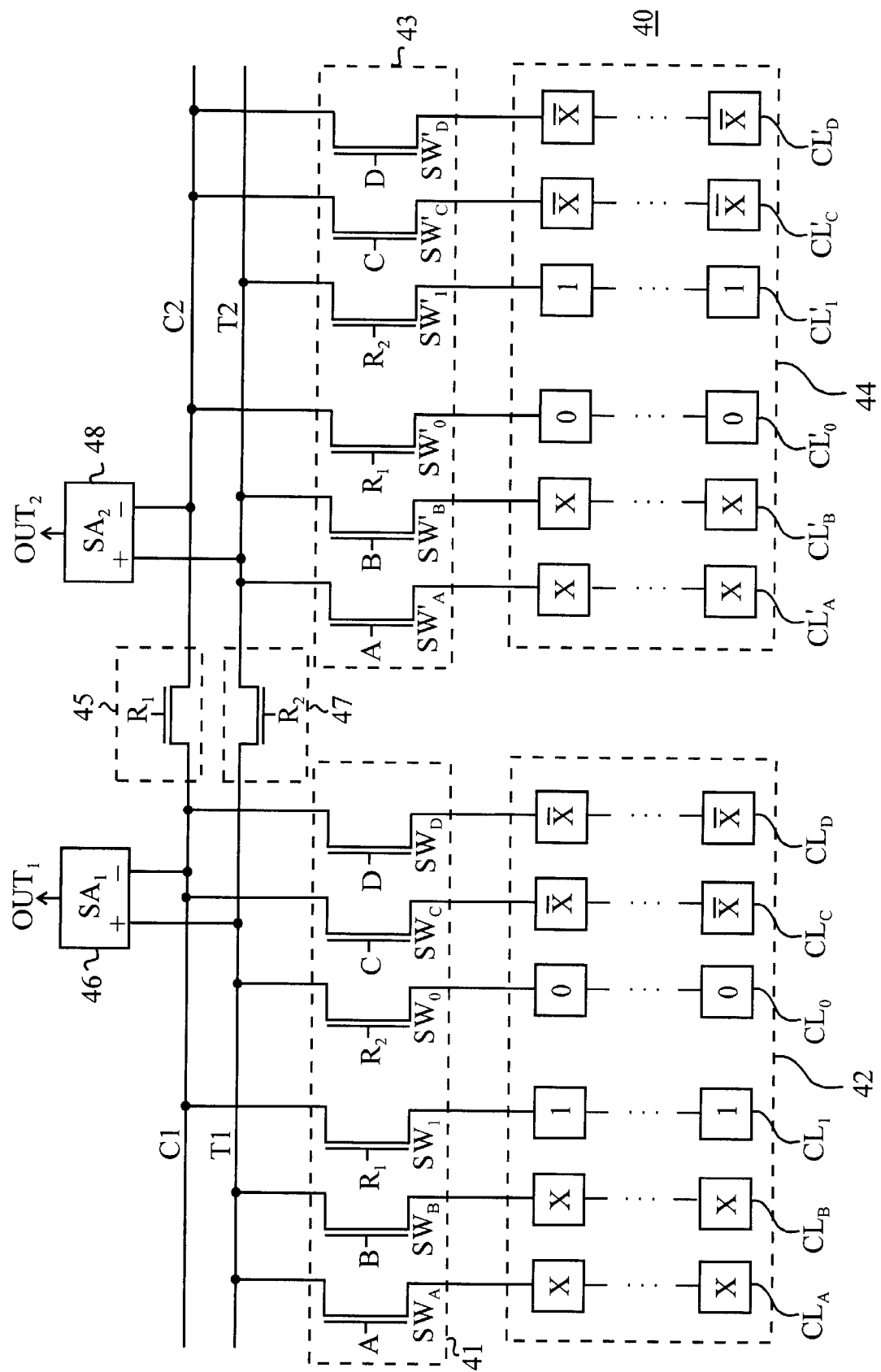
FIG. 4A is a schematic circuit diagram illustrating still another embodiment of an interconnection network of the present invention, using high- and low-level valued reference cell columns to generate a mid-level reference for sense amplifiers.

Referring to FIG. 4A, there is provided another embodiment of an interconnection network in a memory device according to the present invention. In this embodiment, the memory device 40 includes, for example, two sub-arrays 42, 44 of memory cell columns, two switch units 41, 43 associated with the two sub-arrays 42, 44, respectively, two sense amplifiers 46, 48 for sensing data from the two sub-arrays 42, 44 via the two switch units 41, 43, respectively, and two connection units 45, 47 for providing electrical connections between input lines of the two sense amplifiers 46, 48. Each sub-array includes multiple memory cell columns and two reference cell columns which are preferably positioned in the middle of the multiple memory cell columns. For example, the first sub-array 42 has multiple memory cell columns $CL_A$, $CL_B$, $CL_C$, $CL_D$ and two reference cell columns $CL_0$, $CL_1$, which are preferably placed in the middle of the memory cell columns $CL_A$, $CL_B$, $CL_C$, $CL_D$. Each memory cell column has multiple memory cells each having data "1" or "0" (i.e., higher or lower resistance). Reference cell column $CL_i$ has multiple reference cells each having value "1" (i.e., higher resistance), and reference cell column $CL_0$ has multiple reference cells each having value "0" (i.e., lower resistance). In the first sub-array 42, each of the data and reference cell columns $CL_A$, $CL_B$, $CL_C$, $CL_D$, $CL_0$, $CL_1$, is coupled to a corresponding one of multiple switches $SW_A$, $SW_B$, $SW_C$, $SW_D$, $SW_0$, $SW_1$ of the first switch unit 41. The multiple switches $SW_A$, $SW_B$, $SW_C$, $SW_D$, $SW_1$, $SW_0$ receive decoding signals A, B, C, D, $R_1$, $R_2$, respectively, from the decoder depicted in FIG. 2, and are also coupled to input lines of the first sense amplifier 46. For instance, switches $SW_A$, $SW_B$, $SW_0$ are coupled to a true input line T1 of the first sense amplifier 46, and switches $SW_C$, $SW_D$, $SW_1$ are coupled to a complement input line C1 of the first sense amplifier 46.

The second sub-array 44 and the second switch unit 43 have the same configuration as the first sub-array 42 and the first switch unit 41, except for connections between reference switches in the second switch unit 43 and input lines of the second sense amplifier 48. For example, reference switch $SW'_0$ coupled to reference cell column $CL'_0$ having reference cells of value "0", is coupled to true input line T2 of the second sense amplifier 48, and reference switch $SW'_1$ coupled to reference cell column $CL'_1$ having reference cells of value "1", is coupled to complement input line C2 of the second sense amplifier 48.

The first connection unit 45 has a conduction path connecting the complement input lines C1, C2 of the first and second sense amplifiers 46, 48, and the second connection unit 47 has a conduction path connecting the true input lines T1, T2 of the first and second sense amplifiers 46, 48. The first and second connection units 45, 47 are controlled by decoding signals $R_1$, $R_2$, respectively. The connection units 45, 47 each may be realized with an NFET, and in this case the NFETs of the connection units 45, 47 are gated by the decoding signals $R_1$, $R_2$, respectively. Each connection unit has a function of summing currents provided from the respective reference cells in combination with the two sense amplifiers 46, 48 which divide or share the summed current evenly. In other words, currents represented by logic values "1" and "0" are summed by a connection circuit to provide an averaged value "½" to each of the sense amplifiers, as a mid-level reference. For example, the first connection unit 45 has the conduction path of which one end is connected to the complement input line C1 of the first sense amplifier 46 and the reference switch $SW_1$ coupled to the reference cell column $CL_1$ having reference cells of value "1", and the other end is connected to the complement input line C2 of the second sense amplifier 48 and the reference switch $SW'_0$ coupled to the reference cell column $CL'_0$ having reference cells of value "0". Under control of the decoding signal $R_1$, the first connection unit 45 can be electrically connected so that a conduction path is formed via the first connection unit 45 between a selected reference cell of the reference cell column $CL_1$ via the reference switch $SW_1$ and a selected reference cell of the reference cell column $CL'_0$ via the reference switch $SW'_0$. Thereby, values "1" and "0" are summed to provide the reference (i.e., averaged value "½") to complement inputs of the first and second sense amplifiers 46, 48. In a like manner, the second connection unit 47 in response to the decoding signal $R_2$ may sum the values "0" and "1" provided from selected reference cells of the reference cell column $CL_0$ and the reference cell column $CL'_1$, respectively. Once such a conduction path is formed and the currents having logic values "0" and "1" are summed, the first and second sense amplifiers 46, 48 divide or share the summed current so that each sense amplifier receives averaged (i.e., mid-level "½") current.

It should be noted in this embodiment that each sub-array has two reference cell columns of which one has reference cells of value "1" and the other has reference cells of value "0", instead of one reference cell column having reference cells of value "½" (referring to FIGS. 1 and 3). Such configuration of two reference cell columns for a sub-array allows the interconnection network to provide the sense amplifiers with more accurate mid-level reference. This configuration using two reference cell columns for a sub-array is especially useful for a network in which mid-level reference cells are unavailable or display poor correlation to desired mid-level reference signals necessary to bias the sense amplifiers.

A detailed description of switching operation of the switch units and the connection units of FIG. 4A follows.

Assume that decoding signals A and $R_1$ are simultaneously "H", and at the same time all other decoding signals become "L", as driven by the decoder depicted in FIG. 2. In this case, switches $SW_A$, $SW_1$ in the first switch unit 41 are turned on so that memory cell column $CL_A$ and reference cell column $CL_1$ are connected to the true input line T1 and the complement input line C1 of the first sense amplifier 46, respectively. Simultaneously, the switches $SW'_A$ and $SW'_0$ in the second switch unit 43 are turned on so that memory cell column $CL'_A$ and reference cell column $CL'_0$ of the second sub-array 44 are connected to the true input line T2 and the complement input line C2 of the second sense amplifier 48, respectively. Thus, the first sense amplifier 46 receives data from a selected memory cell of the memory cell column $CL_A$ via the switch $SW_A$ and the true input line T1, and the second amplifier 48 receives data from a selected memory cell of the memory cell column $CL'_A$ via the switch $SW'_A$ and the true input line T2. The first connection unit (for example, NFET) 45 is also turned on in response to the decoding signal $R_1$ ("H") so that value "1" provided from the reference cell column $CL_1$ and value "0" provided from the reference cell column $CL'_0$ are summed forming a complement input line network. Then, the inputs of the sense amplifiers 46, 48 source the averaged value "½" to the complement input line network. Each of the sense amplifiers 46, 48 senses input data by comparing the true input data against the reference of mid-level ("½") provided from the complement input line. During this operation, the decoding signals B, C, D, $R_2$ remain "L" so that the switches $SW_B$, $SW_C$, $SW_D$, $SW_0$, $SW\phi_B$, $SW\phi_C$, $SW\phi_D$, $SW\phi_1$ are "off".

Figure 5:
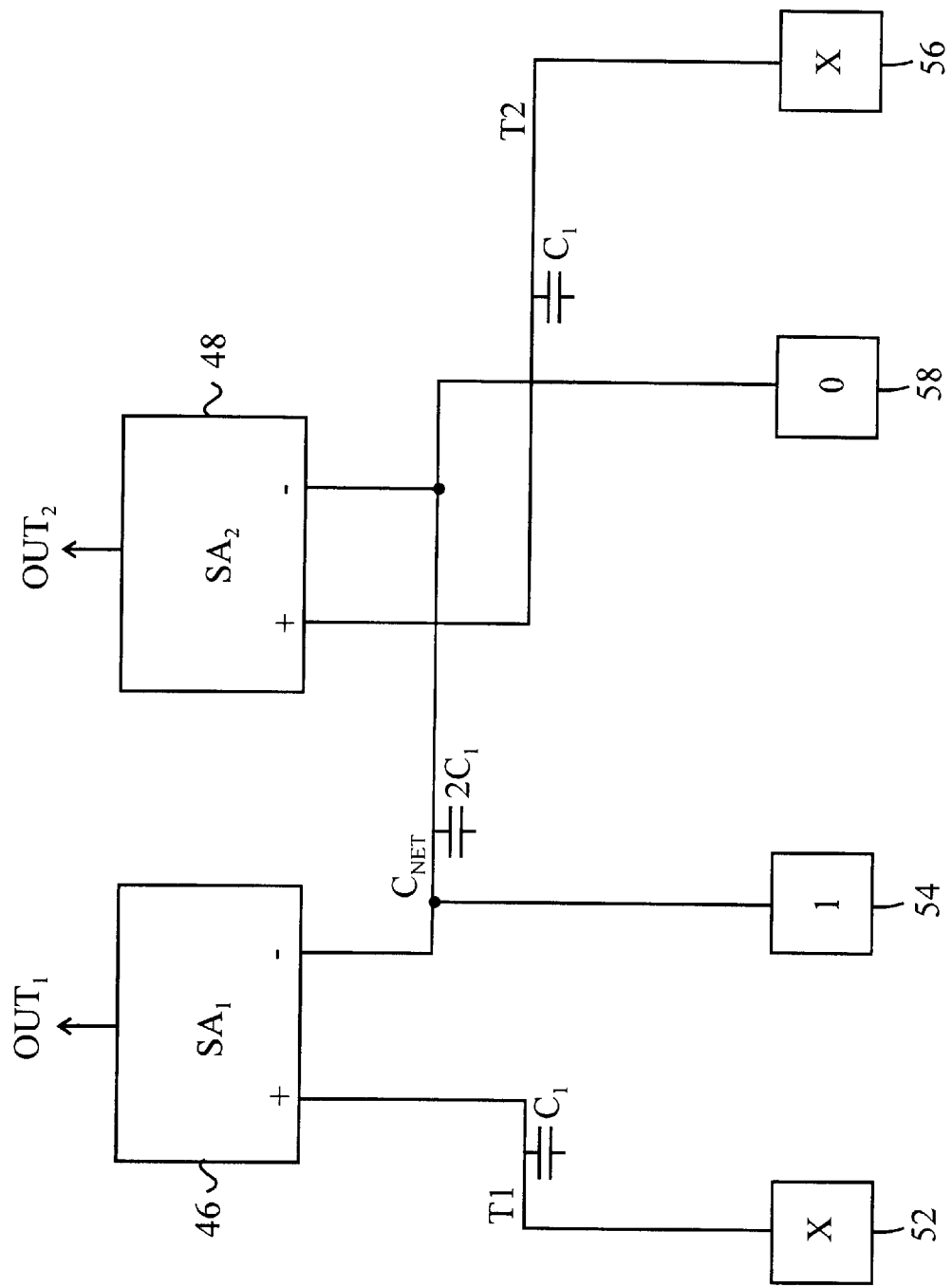
FIG. 5 is a closed-circuit representation of the interconnection network in FIG. 4A.

FIG. 5 schematically shows a closed circuit representation of the aforementioned example (A and $R_1$ are "H") used to illustrate the operation of the interconnection network in FIG. 4A, wherein a memory cell 52 and a reference cell 54 are selected in the first sub-array 42 and a memory cell 56 and a reference cell 58 are selected in the second sub-array 44. Data ("0" or "1") of the selected memory cells 52, 56 are provided to true inputs of the first and second sense amplifiers 46, 48, respectively. Value "1" of the selected reference cell 54 and value "0" of the selected reference cell 58 are summed and divided into two each of which has logic value "½" and is provided as a reference to complement inputs of the first and second sense amplifiers 46, 48. In the closed circuit representation, interconnection networks T1, T2 between the sense amplifiers 46, 48 and the memory cells 52, 56 each have an equal capacitance $C_1$, and interconnection network $C_{NET}$ (complement input line network) between the sense amplifiers 46, 48 and the reference cells 54, 58 has a capacitance $2C_1$. Thus, the closing circuit in FIG. 5 attains symmetry property so that any delay due to capacitance difference caused by asymmetric network may be substantially eliminated.

Referring to FIG. 4A again, assuming that decoding signal C is "H" and decoding signal $R_2$ simultaneously becomes "H", as driven by the decoder depicted in FIG. 2, switches $SW_C$, $SW\phi_C$, $SW_0$, $SW\phi_1$ are turned on so that the memory cell column $CL_C$ and reference cell column $CL_0$ are connected to complement input line C1 and true input line T1 of the first sense amplifier 46, respectively, and the memory cell column $CL\phi_C$ and reference cell column $CL\phi_1$ are connected to complement input line C2 and true input line T2 of the second sense amplifier 48, respectively. The second connection unit 47 controlled by the decoding signal $R_2$ provides a conduction path between the true input lines T1, T2 of the first and second sense amplifiers 46, 48, so that a conduction path is formed via the second connection unit 47 between a selected reference cell of the reference cell column $CL_0$ via the reference switch $SW_0$ and a selected reference cell of the reference cell column $CL'^1$ via the reference switch $SW'_1$. Thereby, values "1" and "0" are summed to provide the reference (i.e., mid-level "½") to true inputs of the first and second sense amplifiers 46, 48. In other words, once such a conduction path is formed and currents having logic values "0" and "1" are summed, the first and second sense amplifiers 46, 48 divide or share the summed current so that each sense amplifier receives averaged (i.e., mid-level "½") current. The sense amplifiers 46, 48 also receive via the respective complement input lines C1, C2 data from selected memory cells of the memory cell columns $CL_C$, $CL\phi_1$. Each sense amplifier 46, 48 then senses data ("1" or "0") from a selected memory cell against the mid-level reference ("½").

Figure 4B:
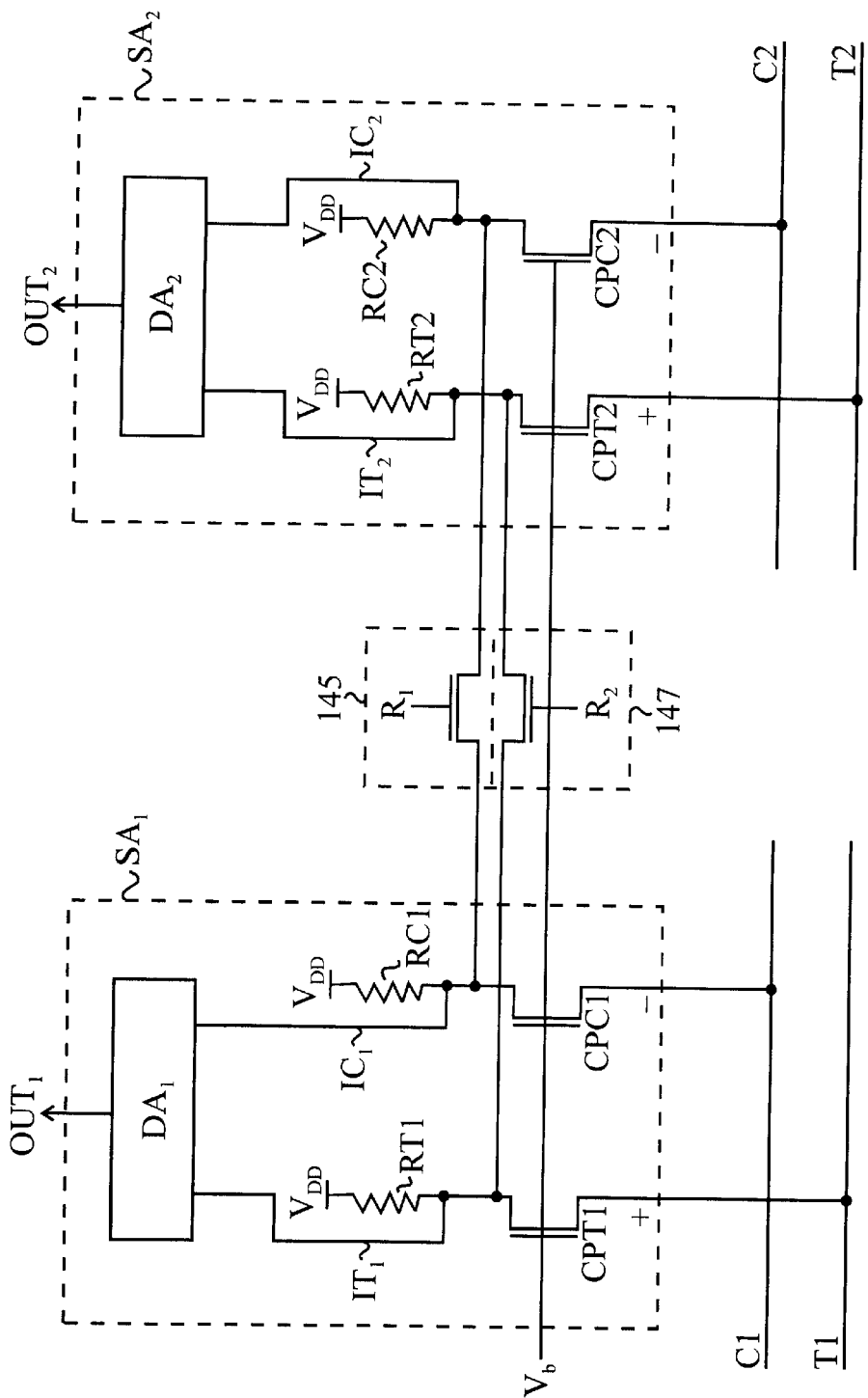
FIG. 4B is a schematic circuit diagram partially illustrating an embodiment of an interconnection network modified from the interconnection network in FIG. 4A.

Referring to FIG. 4B, there is provided a circuit diagram partially illustrating an embodiment of an interconnection network modified from the interconnection network in FIG. 4A. An interconnection network in FIG. 4B has the same switch units (not shown) and sub-arrays (now shown) as those in FIG. 4A; thus a description thereof is omitted. In the interconnection network in FIG. 4B, first and second connection units 145, 147 are disposed between two sense amplifiers $SA_1$, $SA_2$. The first connection unit 145 has a conduction path of which one end is connected to an internal complement line $IC_1$ of the first sense amplifier $SA_1$ and the other end is connected to an internal complement line $IC_2$ of the second sense amplifier $SA_2$. The first connection unit 145 is controlled by a decoding signal $R_1$ to electrically connect or disconnect both the ends of the conduction path of the first connection unit 145. The second connection unit 147 has a conduction path of which one end is connected to an internal true line "$IT_1$" of the first sense amplifier $SA_1$ and the other end is connected to an internal true line $IT_2$ of the second sense amplifier $SA_2$. The second connection unit 147 is controlled by a decoding signal $R_2$ to electrically connect or disconnect both the ends of the conduction path of the second connection unit 147. The first and second connection units 145, 147 may be realized with NFETs. The sense amplifiers each have clamp NFETs CPT1, CPC1, CPT2, CPC2 to clamp voltage on the sense amplifier inputs ("+" and "−") to a substantially equal voltage using a bias voltage $V_b$. The clamp NFETs CPT1, CPC1, CPT2, CPC2 each transfer resultant sense current on the inputs ("+" and "−") onto load resistors in each of which a positive or negative differential voltage difference is developed across the load resistors. A detailed description of the operation of a sense amplifier may be found, for example, in U.S. Pat. No. 5,640,343 to Gallagher et al., and thus will not be presented herein.

Assuming that the complement inputs of the first and second sense amplifiers $SA_1$, $SA_2$ are provided with values "1" and "0", respectively, from selected reference cells in the sub-arrays, the first connection unit 145 is turned on (i.e., electrically connected) in response to the decoding signal $R_1$. Since the complement lines of the first and second sense amplifiers $SA_1$, $SA_2$ are internally connected to each other through the first connection unit 145, the currents on the complement lines having the values "1" and "0", respectively, are summed to produce a summed current which is then divided evenly (i.e., "½") across load resistors RC1, RC2 resulting in a mid-level voltage drop, or in other words an internal "½" state, to be developed across both the resistors. Summing and averaging of the "0" and "1" reference cells is enabled by the connection units 145, 147 of FIG. 4B which serve an almost identical function as the connection units 45, 47 of FIG. 4A.

Continuing the description of FIG. 4B, the first and second sense amplifiers $SA_1$, $SA_2$ generate first and second outputs $OUT_1$, $0UT_2$ following a three step process: First, data from the memory cells are transferred as current from true input lines T1, T2 of sense amplifiers SA1, SA2 through the clamp NFETs CPT1, CPT2 and to the internal nodes $IT_1$, $IT_2$, respectively. Concurrently, reference data "0" and "1" are transferred as current from the complement input lines C1, C2 of the sense amplifiers SA1, SA2 through the clamp NFETs CPC1, CPC2 and to the internal nodes $IC_1$, $IC_2$, respectively. Second, voltage drops (nodes $IT_1$, $IT_2$) are developed across load resistors RT1, RT2, corresponding to the "0" or "1" state of the memory cells, while a "½" state reference voltage drop (common nodes $IC_1$, $IC_2$) is developed, according to the description in the prior paragraph, across the parallel combination of load resistors RC1, RC2 connected together via the connection unit 145. Third, each differential amplifier $DA_1$ ($DA_2$) compares the voltage on its true input node $IT_1$ ($IT_2$) with that of the voltage on its complement input node $IC_1$ ($IC_2$) to determine the binary signal to drive through output $OUT_1$ ($0UT_2$); the state of the memory cell is compared against a reference voltage. If the voltage on the node $IT_1$ ($IT_2$) is greater than that of the node $IC_1$($IC_2$), then state "1" is driven through output $OUT_1$ ($0UT_2$). However if the voltage on node $IT_1$ ($IT_2$) is less than that of $IC_1$ ($IC_2$), then state "0" is driven through output $OUT_1$ ($OUT_2$). In this example, the true inputs T1, T2 receive data from the memory cells while the complement inputs C1, C2 receive the "0" and "1" reference signals from reference cells of course, the converse scenario also occurs. The complement inputs C1, C2 can receive data from the memory cells while the true inputs T1, T2 receive the "0" and "1" reference signals from reference cells, in which case connection unit 147 is activated to connect true nodes $IT_1$, $IT_2$, thus forming a common reference node.

Figure 6:
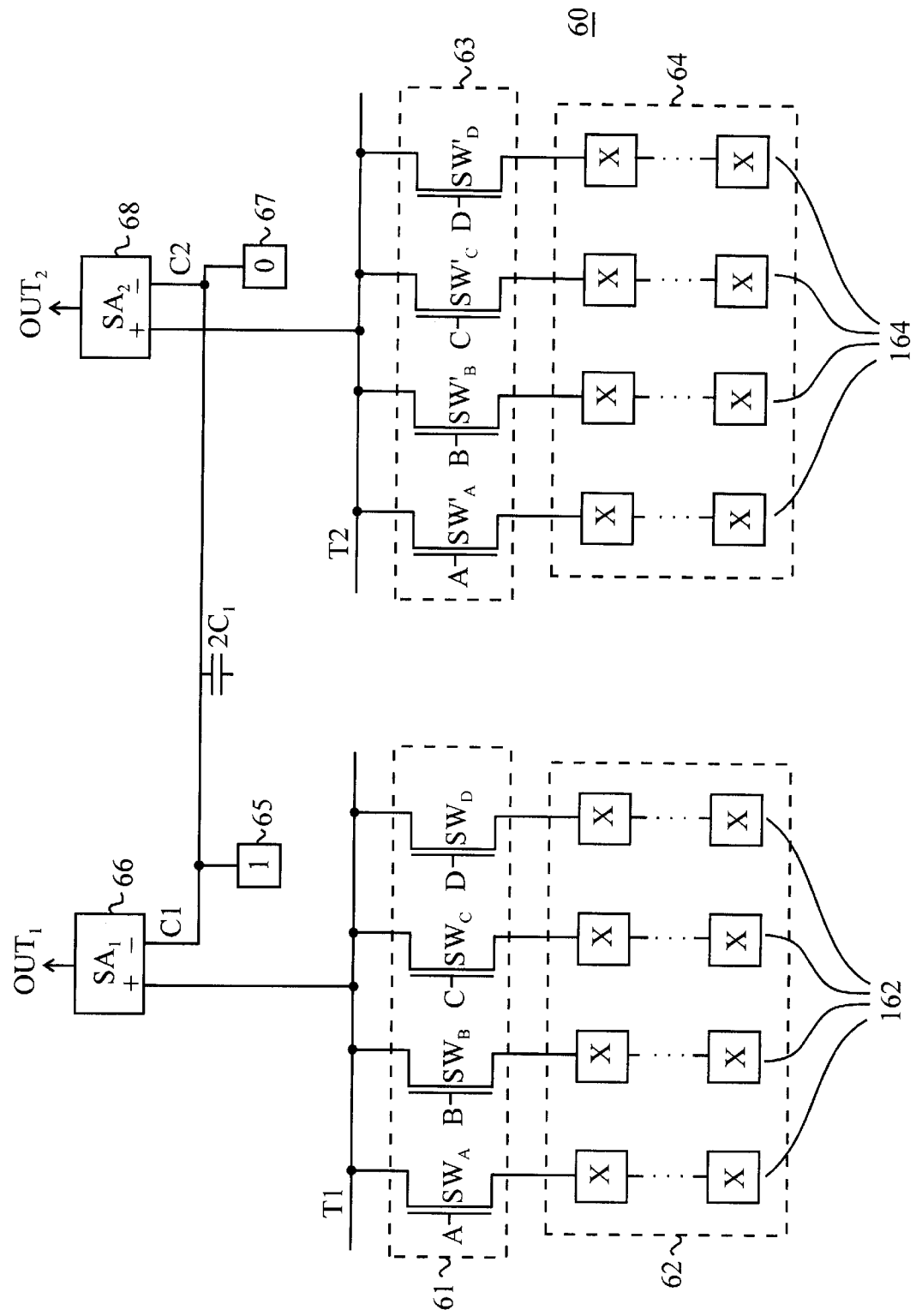
FIG. 6 is a schematic circuit diagram illustrating still another embodiment of an interconnection network of the present invention, using a pair of reference cells for providing a reference to a pair of sense amplifiers.

Referring to FIG. 6, there is provided another embodiment of an interconnection network for connecting memory cells to sense amplifiers according to the present invention. A memory device 60 includes first and second sub-arrays 62, 64, first and second switch units 61, 63 associated with the first and second sub-arrays 62, 64, respectively, first and second reference cells 65, 67 having value "1" and "0", respectively, and first and second sense amplifiers 66, 68 for sensing data from selected memory cells of the first and second sub-arrays 62, 64, respectively. The first and second sub-arrays 62, 64 each have multiple memory cell columns 162, 164, and each memory cell column has multiple memory cells each having data "1" or "0". The first switch unit 61 has multiple switches $SW_A$–$SW_D$ each of which is connected to a corresponding memory cell column 162 of the first sub-array 62. The second switch unit 62 has multiple switches $SW'_A$–$SW'_D$ each of which is connected to a corresponding memory cell column 164 of the second sub-array 64. The switches $SW_A$–$SW_D$ of the first switch unit 61 are controlled by decoding signals A–D, respectively, and the switches $SW'_A$–$SW'_D$ of the second switch unit 63 are also controlled by the same decoding signals A–D, respectively. The decoding signals selectively control the switches such that data in selected memory cells are simultaneously provided to the sense amplifiers 66, 68. For example, if decoding signal A is "H", then switches $SW_A$ and $SW'_A$ are turned on. Thus, data in a selected memory cell of a memory cell column 162 coupled to the switch $SW_A$ is provided to the first sense amplifier 66 via a first true input line T1, and data in a selected memory cell of a memory cell column 164 coupled to the switch $SW'_A$ is provided to the second sense amplifier 68 via a second true input line T2.

The sense amplifiers 66, 68 are provided with a reference signal from first and second reference cells 65, 67 via complement input lines C1, C2. As shown in FIG. 6, the first and second reference cells 65, 67 are disposed outside the memory sub-arrays 62, 64, instead of reference cell columns disposed in the middle of the sub-arrays. The first reference cell 65 with value "1" and the second reference cell 67 with value "0" are connected to each other, and a connection node of the reference cells 65, 57 is coupled to the complement input lines C1, C2 of the sense amplifiers 66, 68. Thus, the values "1" and "0" in the reference cells 65, 67 are summed and averaged to a mid-level "½" in conjunction with the sense amplifiers 66, 68, and the mid-level "½" is provided as a reference to the first and second sense amplifiers 66, 67 via the first and second complement input lines C1, C2, respectively. The sense amplifiers 66, 68 each then sense data ("0" or "1") from a selected memory cell and compare it to the reference ("½").

In this embodiment, the first and second reference cells 65, 67 continuously provide the reference ("½") since they are connected directly to the complement inputs of the sense amplifiers 66, 68. In the interconnection network in FIG. 6, an attempt to balance the capacitance of complement data network is made so that the capacitance is twice as much as that of a single true data network, and hence quasi-symmetric configuration is attained.

Figure 7:
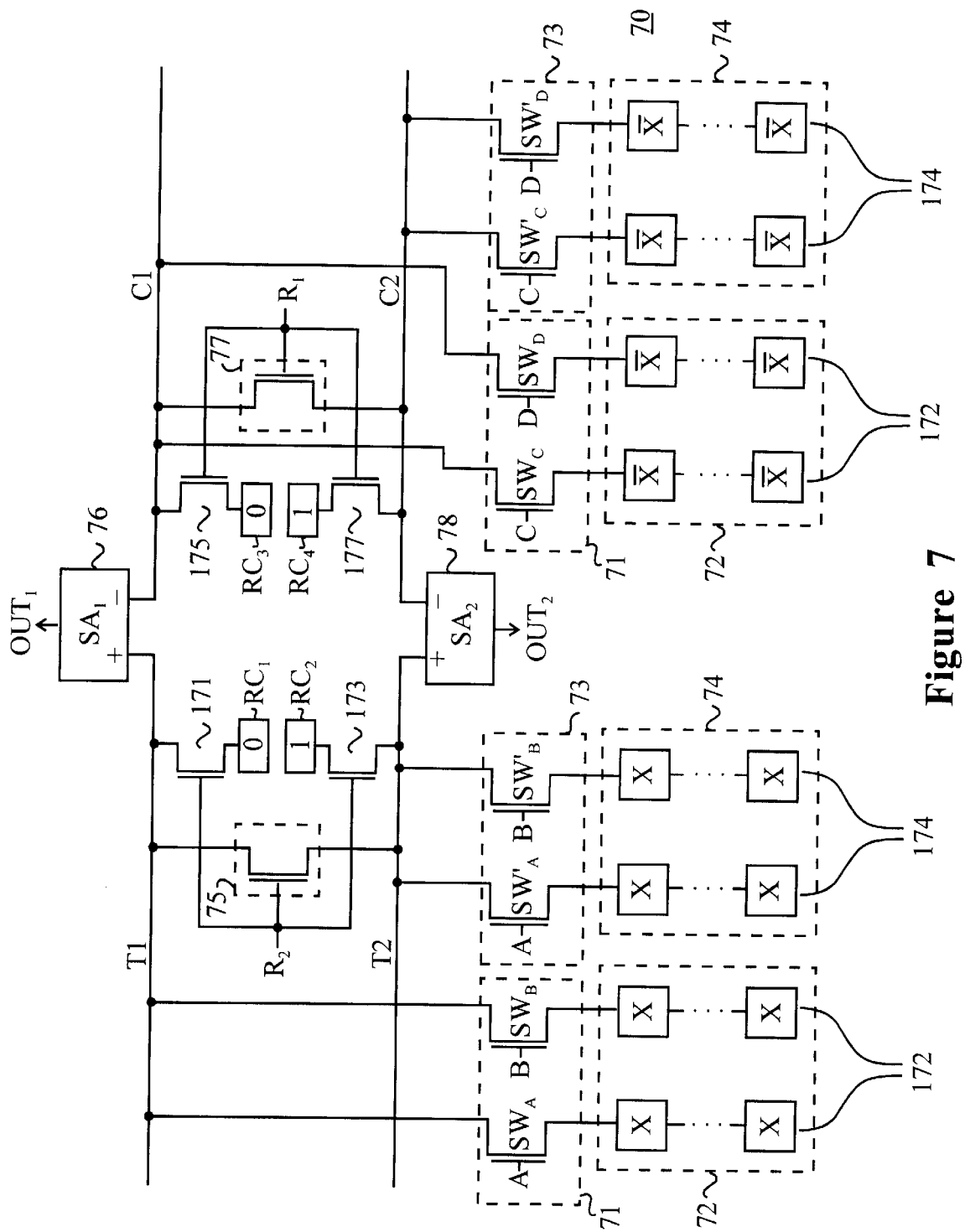
FIG. 7 is a schematic circuit diagram illustrating still another embodiment of an interconnection network of the present invention, using multiple reference cells for selectively providing a reference to sense amplifiers.

Referring to FIG. 7, there is provided still another embodiment of an interconnection network for connecting memory cells to sense amplifiers according to the present invention. A memory device 70 includes first and second sub-arrays 72, 74, first and second switch units 71, 73 associated with the first and second sub-arrays 72, 74, respectively, first and second sense amplifiers 76, 78 for sensing data provided from the first and second sub-arrays 72, 74, respectively, first through fourth reference cells $RC_1$–$RC_4$ for providing reference signals to the first and second sense amplifiers 76, 78, and first and second connection units 75, 77 each for providing an electrical connection between the first and second reference cells $RC_1$, $RC_2$ and the true inputs of sense amplifiers 76, 78 or the third and fourth reference cells $RC_3$, $RC_4$ and the complement inputs of the sense amplifiers 76, 78.

The first and second sub-arrays 72, 74 each have multiple memory cell columns 172, 174 each of which includes a series of memory cells. Each memory cell stores data "1" or "0". The first and second switch units 71, 73 each have multiple switches $SW_A$–$SW_D$, $SW'_A$–$SW'_D$ each of which is connected to a corresponding memory cell column. In this embodiment, four reference cells $RC_1$–$RC_4$ are used to provide a reference to the sense amplifiers 76, 78, and each reference cell is connected to a corresponding input line of the sense amplifiers via a switch (e.g., NFET). For example, a first NFET 171 has a conduction path between the first reference cell $RC_1$ and the true input line T1 of the first sense amplifier 76, a second NFET 173 has a conduction path between the second reference cell $RC_2$ and the true input line T2 of the second sense amplifier 78, a third NFET 175 has a conduction path between the third reference cell $RC_3$ and the complement input line C1 of the first sense amplifier 76, and a fourth NFET 177 has a conduction path between the fourth reference cell $RC_4$ and the complement input line C2 of the second sense amplifier 78. The first and second NFETs 171, 173 are gated by decoding signal $R_2$, and the third and fourth NFETs 175, 177 are gated by decoding signal $R_1$. The first reference switch 75 gated by the decoding signal $R_2$ has a conduction path between the first and second NFETs 171, 173 such that the first and second reference cells $RC_1$, $RC_2$ are connected via the NFETs 171, 173 and the first connection unit 75 in response to the decoding signal $R_2$. In a like manner, the second connection unit 77 gated by the decoding signal $R_1$ also has a conduction path between the third and fourth NFETs 175, 177 such that the third and fourth reference cells $RC_3$, $RC_4$ are connected via the NFETs 175, 177 and the second reference switch 77 in response to the decoding signal $R_1$.

The decoder 20 in FIG. 2 is applicable to the interconnection network in FIG. 7. Assuming that the two-bit address data $ADDR_1$, $ADDR_2$ is "00", decoding signals A, $R_1$ become "H" and other decoding signals B–D, $R_2$ become "L". Responding to the decoding signals, switches $SW_A$, $SW'_A$ are turned on so that data from selected memory cells in different memory cell columns 172, 174 are provided to the true input lines T1, T2 of the first and second sense amplifiers 76, 78 via the switches $SW_A$, $SW'_A$, respectively. At the same time, responding to the activated decoding signal $R_1$, the second connection unit 77 and the third and fourth NFETs 175, 177 are turned on so that the values "0" and "1" stored in the reference cells $RC_3$, $RC_4$ are summed. The sense amplifiers 76, 78 then evenly divide and share the summed current via the respective complement input lines C1, C2. Each sense amplifier then generates an output by sensing the data provided via the corresponding true input line and comparing it with the shared reference provided via the corresponding complement input line.

It should be noted in FIG. 7 that the interconnection network attains symmetry with respect to the true and complement input lines of the sense amplifiers. In other words, each sense amplifier has a true input line network and a complement input line network which respectively have a substantially equal number of switches. For example, the four input line networks T1, T2, C1, C2 have the equal number of switches, thus have the same capacitance.

Figure 8:
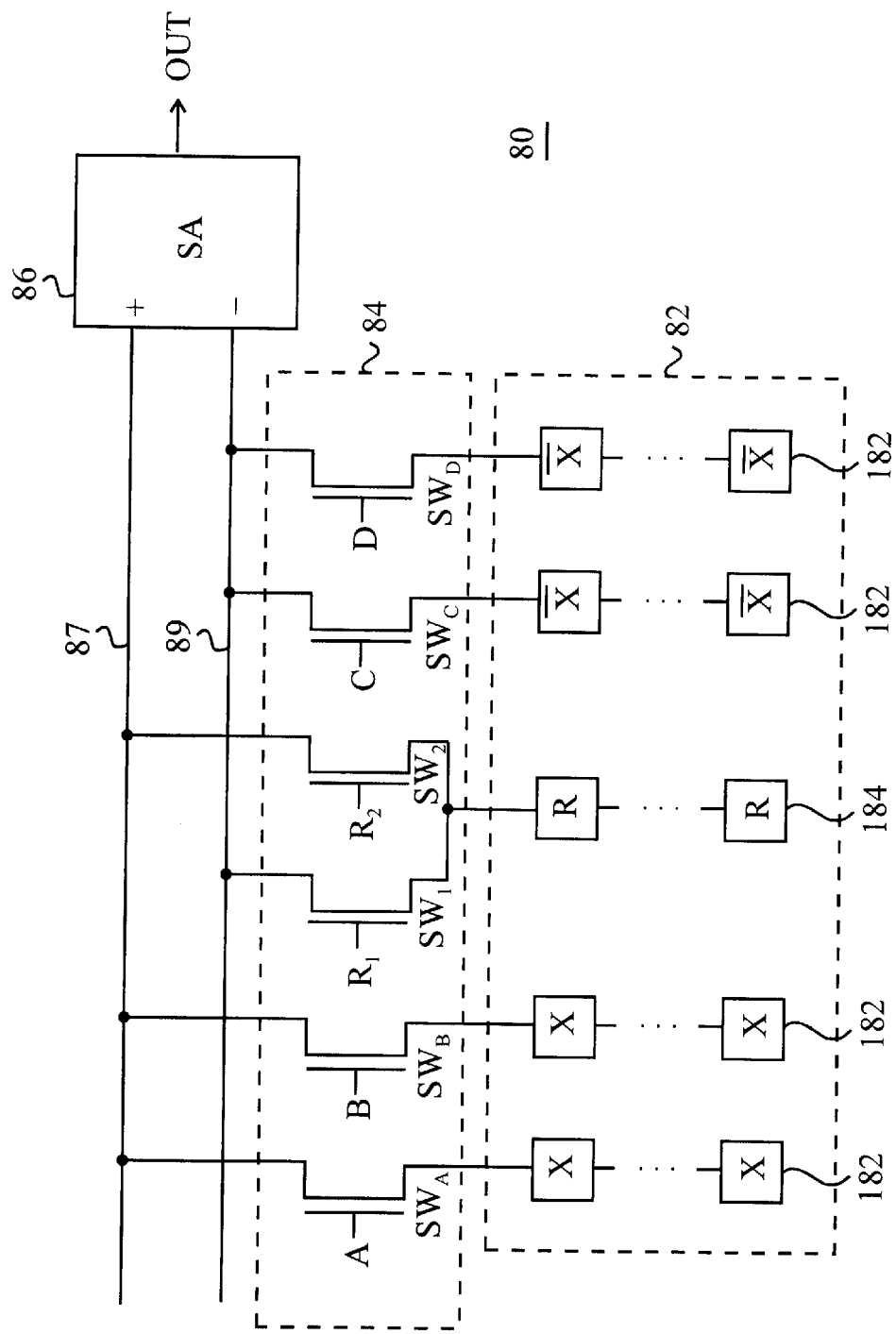
FIG. 8 is a schematic circuit diagram illustrating still another embodiment of an interconnection network of the present invention, using a reference cell column shared by true and complement input networks of a sense amplifier.

Referring to FIG. 8, there is provided still another embodiment of an interconnection network for connecting memory cells to sense amplifiers according to the present invention. A memory device 80 includes a sub-array 82 having memory cell columns 182 and a reference cell column 184, wherein each memory cell column includes a series of memory cells each having data "0" or "1" and each reference cell column includes a series of reference cells each having mid-level reference "½". A switch unit 84 associated with the sub-array 82 includes multiple switches $SW_A$–$SW_D$ each of which is coupled to corresponding one of the memory cell columns 182 and two reference switches $SW_1$, $SW_2$ which are coupled in parallel to the reference cell column 184. A sense amplifier 86 has a true input line 87 and a complement input line 89. Memory cell columns coupled to the true input line 87 via the corresponding switches $SW_A$, $SW_B$ have memory cells in which data is stored in its true form X, and memory cell columns coupled to the complement input line 89 via the corresponding switches $SW_C$, $SW_D$ have memory cells in which data is stored in its complement form $\overline{X}$. The reference switches each are alternatively connected to either the true or complement input line of the sense amplifier 86. For example, a first reference switch $SW_1$ is connected to the complement input line 89, and a second reference switch $SW_2$ to the true input line 87. The switches $SW_A$–$SW_D$ are controlled by decoding signals A–D, respectively, and the reference switches $SW_1$, $SW_2$ are controlled by decoding signals $R_1$, $R_2$, respectively.

The decoder 20 in FIG. 2 is also applicable to the interconnection network in FIG. 8. Assuming that the two-bit address data is "00" so that the decoder 20 generates decoding signals A, $R_1$ activated to "H" and decoding signals B–D, $R_2$ inactivated to "L". In response to the decoding signals A–D, $R_1$, $R_2$, switch $SW_A$ and reference switch $SW_1$ are turned on. As a result, data from a selected memory cell in the memory cell column 182 coupled to the switch $SW_A$ is transferred to the true input line 87, and reference from a selected reference cell in the reference cell column 184 is transferred to the complement input line 89. In a like manner, when decoding signal B becomes "H" so that data from a selected memory cell in the memory cell column 182 coupled to the switch $SW_B$ is transferred to the true input line 87, the decoding signal $R_1$ also becomes "H" so that reference from a selected reference cell in the reference cell column 184 is transferred to the complement input line 89. If one of the decoding signals C, D becomes "H" so that data from a selected memory cell in a corresponding memory cell column is transferred to the complement input line 89, decoding signal $R_2$ becomes "H" so that reference from a selected reference cell in the reference cell column 184 is transferred to the true input line 87. Thus, it should be noted that the reference switches $SW_1$, $SW_2$ constitute a switching portion through which the input lines 87, 89 of the sense amplifier 86 share the reference provided from the reference cell column 184.

Having described preferred embodiments of an interconnection network for connecting memory cells to sense amplifiers according to the present invention, it is noted that modifications and variations can be readily made by persons skilled in the art in light of the above teachings. For example, such reference switches for allowing input lines of a sense amplifier to share a reference source as shown in FIG. 8 may also be applicable to other embodiments in the above description. It is therefore to be understood that the above embodiments are intended to be illustrative, and that any changes may be made in the particular embodiments disclosed, which are within the scope and spirit of the invention as outlined by the appended claims.

What is claimed is:

1. An interconnection network for connecting data and reference cells to sense amplifiers in a memory device, comprising:

at least one sub-array having multiple memory cell columns and at least one reference cell column, wherein each memory cell column has a series of memory cells and each reference cell column has a series of reference cells; and at least one switch unit associated with the at least one sub-array, for selectively connecting the multiple memory cell columns to one of two inputs of a sense amplifier and selectively connecting the at least one reference cell column to the other of the two inputs of the sense amplifier, wherein the two inputs of the sense amplifier are substantially symmetric to each other such that each of the two inputs has substantially equal number of connections with the at least one switch unit.

2. The interconnection network as defined in claim 1, wherein the at least one reference cell column has a series of reference cells, each reference cell having a reference which has a mid-level value between a high and a low value of data in the memory cells.

3. The interconnection network as defined in claim 1, wherein the at least one switch unit includes:
    a plurality of switches each of which has a conduction path of which one end is connected to a corresponding memory cell column and the other end is connected to one of the two inputs of the sense amplifier; and
    at least one reference switch having a conduction path of which one end is connected to the at least one reference cell column and the other end is connected to the other of the two inputs of the sense amplifier,
    wherein the plurality of switches and the at least one reference switch are selectively switched under control of decoding signals externally applied.

4. The interconnection network as defined in claim 3, wherein the two inputs of the sense amplifier each have substantially equal number of connections with the plurality of switches and the at least one reference switch.

5. The interconnection network as defined in claim 3, further including a decoder for decoding address data to generate the decoding signals.

6. The interconnection network as defined in claim 1, wherein the at least one switch unit includes:
    a plurality of switches each of which has a conduction path of which one end is connected to a corresponding memory cell column and the other end is connected to one of the two inputs of the sense amplifier; and
    first and second reference switches having first and second conduction paths, respectively, the first conduction path connecting the at least one reference cell column to one of the two inputs and the second conduction path connecting the at least one reference cell column to the other of the two inputs of the sense amplifier,
    wherein the plurality of switches and the first and second reference switches are selectively switched under control of decoding signals externally applied.

7. The interconnection network as defined in claim 1, wherein each of the at least one sub-array includes first and second reference cell columns each having a series of reference cells, the first reference cell column having reference cells of logic high value and the second reference cell column having reference cells of logic low value, wherein the sense amplifiers are provided with a reference obtained from data of the logic high value and the logic low value stored in reference cells in the first and second reference cell columns, respectively.

8. The interconnection network as defined in claim 7, wherein the at least one switch unit includes:
    a plurality of switches each of which has a conduction path of which one end is connected to a corresponding memory cell column and the other end is connected to one of two inputs of a sense amplifier; and
    first and second reference switches having first and second conduction paths, respectively, the first conduction path connecting the first reference cell column to one of the two inputs and the second conduction path connecting the second reference cell column to the other of the two inputs of the sense amplifier,
    wherein the plurality of switches and the first and second reference switches are selectively switched under control of decoding signals externally applied.

9. The interconnection network as defined in claim 8, further including:
    a first connection unit for connecting first inputs of two sense amplifiers in response to a decoding signal externally applied; and
    a second connection unit for connecting second inputs of the two sense amplifiers in response to another decoding signal externally applied.

10. The interconnection network as defined in claim 9, wherein each of the two sense amplifiers receives data from a selected memory cell via a first input and a reference via a second input, the reference being obtained by averaging the logic high and low values of two selected reference cells in the first and second reference cell columns, respectively.

11. The interconnection network as defined in claim 10, wherein the first inputs and the second inputs of the two sense amplifiers each have substantially equal number of connections with switches and connection units.

12. The interconnection network as defined in claim 9, wherein the first and second connection units internally connect the first inputs and the second inputs, respectively, such that internal lines of the first inputs are connected to each other via the first connection unit and internal lines of the second inputs are connected to each other via the second connection unit.

13. An interconnection network for connecting data and reference cells to sense amplifiers in a memory device, comprising:
    a plurality of sub-arrays each having multiple memory cell columns, each memory cell column having a series of memory cells;
    a plurality of switch units each of which is associated with a corresponding one of the plurality of sub-arrays, each switch unit selectively connecting the memory cell columns to one of two inputs of a sense amplifier under control of decoding signals externally applied, whereby data in a selected memory cell in a selected memory cell column is provided to the sense amplifier; and
    at least one reference cell disposed outside the plurality of sub-arrays, for providing a reference to the other of the two inputs of the sense amplifier,
    wherein the interconnection network is substantially symmetric such that each amplifier has substantially equal number of connections with the plurality of switch units and the at least one reference cell.

14. The interconnection network as defined in claim 13, wherein each of the plurality of switch units includes a plurality of switches each of which has a conduction path of which one end is connected to a corresponding memory cell column and the other end is connected to one of two inputs of a sense amplifier, wherein the plurality of switches are selectively switched under control of the decoding signals.

15. The interconnection network as defined in claim 14, wherein the at least one reference cell includes:
    a first reference cell storing logic high value; and
    a second reference cell storing logic low value, the second reference cell being electrically connected to the first reference cell,
    wherein a connection node is formed between the first and second reference cells, and a pair of sense amplifiers coupled to the connection node share a reference obtained from the logic high and low values in the first and second reference cells.

16. The interconnection network as defined in claim 15, wherein each of the two inputs of a sense amplifier has substantially equal number of connections with the plurality of switches.

17. The interconnection network as defined in claim 14, wherein the at least one reference cell includes:
    a first pair of reference cells storing logic high and low values, respectively, for providing a first reference to first inputs of a pair of sense amplifiers; and a second pair of reference cells storing logic high and low values, respectively, for providing a second reference to second inputs of the pair sense amplifiers.

18. The interconnection network as defined in claim 17, further including:
    a first switch portion for connecting the first pair of reference cells to each other in response to a decoding signal, whereby the first reference is provided to the first inputs of the pair of sense amplifiers; and
    a second switch portion for connecting the second pair of reference cells to each other in response to another decoding signal, whereby the second reference is provided to the second inputs of the pair of sense amplifiers.

19. The interconnection network as defined in claim 18, wherein the first switch portion includes:
    a first switch for connecting the first input of one of the pair of sense amplifiers and one of the first pair of reference cells;
    a second switch for connecting the first input of the other of the pair of sense amplifiers and the other of the first pair of reference cells; and
    a third switch for connecting the first inputs to each other,
    wherein the first through third switches are simultaneously switched in response to the decoding signal.

20. The interconnection network as defined in claim 19, wherein the second switch portion includes:
    a fourth switch for connecting the second input of one of the pair of sense amplifiers and one of the second pair of reference cells;
    a fifth switch for connecting the second input of the other of the pair of sense amplifiers and the other of the second pair of reference cells; and
    a sixth switch for connecting the second inputs to each other,
    wherein the fourth through sixth switches are simultaneously switched in response to another decoding signal.

21. The interconnection network as defined in claim 13, further including a decoder for decoding address data to generate the decoding signals.

22. A method for connecting memory cell columns and reference cell columns to sense amplifiers each having true and complement inputs, comprising the steps of:
    (a) providing first set of connections between the true inputs and memory cell columns having data stored in true form;
    (b) providing second set of connections between the complement inputs and memory cell columns having data stored in complement form;
    (c) providing third set of connections between the true and complement inputs and reference cell columns;
    (d) selecting at least one of the first set of connections to electrically connect corresponding at least one of the memory cell columns to at least one of true inputs, and simultaneously selecting at least one of the third set of connections to electrically connect corresponding at least one of the reference cell columns to at least one of the complement inputs; and
    (e) selecting at least one of the second set of connections to electrically connect corresponding at least one of the memory cell columns to at least one of complement inputs, and simultaneously selecting at least one of the third set of connections to electrically connect corresponding at least one of the reference cell columns to at least one of the true inputs.

23. The method as defined in claim 22, wherein the true and complement inputs each have substantially equal number of connections of the first, second, and third sets of connections.

24. The method as defined in claim 22, wherein each of the reference cell columns has a series of reference cells each of which stores a reference which is mid-level between high and low levels of data in memory cell columns.

25. The method as defined in claim 22, wherein the reference cell columns include a first set of reference cell columns each having a series of reference cells storing a high level value, and a second set of reference cell columns each having a series of reference cells storing a low level value.

26. The method as defined in claim 25, wherein the step (d) includes:
    (f) selectively connecting one of the first set of reference cell columns to one complement input;
    (g) selectively connecting one of the second set of reference cell column to another complement input;
    (h) electrically connecting the one of the first set of reference cell columns and the one of the second set of reference cell columns to sum the high and low values stored in the ones of the first and second sets of reference cell columns, respectively;
    (i) sharing a value summed in the step (h) as a reference by the one and another complement inputs.

27. The method as defined in claim 25, wherein the step (e) includes:
    (j) selectively connecting one of the first set of reference cell columns to one true input;
    (k) selectively connecting one of the second set of reference cell columns to another true input;
    (l) electrically connecting the one of the first set of reference cell columns and the one of the second set of reference cell columns to sum the high and low values stored in the ones of the first and second sets of reference cell columns, respectively;
    (m) sharing a value summed in the step (l) as a reference by the one and another true inputs.

28. The method as defined in claim 22, wherein the memory cell columns and the reference cell columns are arranged within sub-arrays in a memory device.

29. A method for connecting memory cells and reference cells to sense amplifiers each having true and complement inputs, comprising the steps of:
    (n) providing first set of connections between the true inputs and memory cell columns each of which has a series of memory cells having data stored in true form;
    (o) providing second set of connections between the complement inputs and memory cell columns each of which has a series of memory cells having data stored in complement form;
    (p) providing third set of connections between the true and complement inputs and reference cells each having one of high and low level values;
    (q) selecting two of the first set of connections to electrically connect corresponding two of the memory cell columns to corresponding two true inputs, respectively, and electrically connecting a pair of reference cells having the high and low level values, respectively, to produce a summed value which is shared by two complement inputs corresponding to the two true inputs; and (r) selecting two of the second set of connections to electrically connect corresponding two of the memory cell columns to corresponding two complement inputs, respectively, and electrically connecting a pair of reference cells having the high and low level values, respectively, to produce a summed value which is shared by two true inputs corresponding to the two complement inputs.

30. The method as defined in claim 29, wherein the memory cell columns are arranged within sub-arrays and the reference cells are disposed outside the sub-arrays.

31. The method as defined in claim 29, wherein the true and complement inputs each have substantially equal number of connections of the first, second, and third sets of connections.

* * * * *